US012180095B2

(12) United States Patent
Yang et al.

(10) Patent No.: US 12,180,095 B2
(45) Date of Patent: Dec. 31, 2024

(54) ELECTROLYSIS ELECTRODE AND PREPARATION METHOD THEREFOR, ELECTROLYSIS APPARATUS, AND CLOTHING TREATMENT DEVICE

(71) Applicant: WUXI LITTLE SWAN ELECTRIC CO., LTD., Wuxi (CN)

(72) Inventors: Qingbo Yang, Wuxi (CN); Cunling Zhou, Wuxi (CN); Ming Xiong, Wuxi (CN); Dengjun Wu, Wuxi (CN)

(73) Assignee: WUXI LITTLE SWAN ELECTRIC CO., LTD., Wuxi (CN)

( * ) Notice: Subject to any disclaimer, the term of this patent is extended or adjusted under 35 U.S.C. 154(b) by 533 days.

(21) Appl. No.: 17/604,749

(22) PCT Filed: Dec. 23, 2019

(86) PCT No.: PCT/CN2019/127645
§ 371 (c)(1),
(2) Date: Oct. 18, 2021

(87) PCT Pub. No.: WO2020/215770
PCT Pub. Date: Oct. 29, 2020

(65) Prior Publication Data
US 2022/0204368 A1    Jun. 30, 2022

(30) Foreign Application Priority Data

Apr. 26, 2019    (CN) .......................... 201910346470.6
May 17, 2019    (CN) .......................... 201910415321.0

(51) Int. Cl.
*C02F 1/461*    (2023.01)
*C02F 1/467*    (2023.01)
(Continued)

(52) U.S. Cl.
CPC ........ *C02F 1/46109* (2013.01); *C02F 1/4672* (2013.01); *C23C 14/0036* (2013.01);
(Continued)

(58) Field of Classification Search
None
See application file for complete search history.

(56) References Cited

U.S. PATENT DOCUMENTS

| 2015/0299844 A1 | 10/2015 | Kessler et al. |
| 2015/0376804 A1 | 12/2015 | Gorokhovsky et al. |
| 2017/0204526 A1 | 7/2017 | Yoshinaga et al. |

FOREIGN PATENT DOCUMENTS

| CN | 1393590 A | 1/2003 |
| CN | 1772955 A | 5/2006 |

(Continued)

OTHER PUBLICATIONS

Supplementary European Search Report issued on Jul. 5, 2022 regarding the EP counterpart 19925742.9.
(Continued)

*Primary Examiner* — Levon J Shahinian

(57) ABSTRACT

An electrolysis electrode and a preparation method therefor, an electrolysis apparatus, and a clothing treatment device. The electrolysis electrode includes a substrate, a transition layer, and an electrode catalytic material layer, and the transition layer is attached to the surface of the substrate, the electrode catalytic material layer is attached to the surface of the transition layer, and the thickness of the transition layer satisfies that: electrons can pass through the transition layer. The transition layer of the electrolysis electrode is relatively thin, so that electrons can pass through the transition layer due to a quantum tunneling effect, and thus the electrocatalytic performance of the electrolysis electrode is basically not affected. Furthermore, the transition layer plays the role
(Continued)

of transition connection, and can greatly improve the phenomenon of cracks in the electrode catalytic material layer.

7 Claims, 2 Drawing Sheets

(51) Int. Cl.
| | |
|---|---|
| C23C 14/00 | (2006.01) |
| C23C 14/08 | (2006.01) |
| C23C 14/35 | (2006.01) |
| C23C 16/40 | (2006.01) |
| C23C 16/455 | (2006.01) |
| D06F 39/02 | (2006.01) |
| D06F 39/06 | (2006.01) |
| C02F 101/30 | (2006.01) |
| C02F 103/30 | (2006.01) |

(52) U.S. Cl.
CPC ............ *C23C 14/081* (2013.01); *C23C 14/35* (2013.01); *C23C 16/403* (2013.01); *C23C 16/45534* (2013.01); *C23C 16/45555* (2013.01); *D06F 39/022* (2013.01); *D06F 39/06* (2013.01); *C02F 2001/46142* (2013.01); *C02F 2101/308* (2013.01); *C02F 2103/30* (2013.01); *C02F 2305/023* (2013.01)

(56) References Cited

FOREIGN PATENT DOCUMENTS

| | | | |
|---|---|---|---|
| CN | 102174704 | A | 9/2011 |
| CN | 103647053 | A | 3/2014 |
| CN | 105836854 | A | 8/2016 |
| CN | 106521873 | A | 3/2017 |
| CN | 108408848 | A | 8/2018 |
| CN | 109534460 | A | 3/2019 |
| JP | 2012251195 | | 12/2012 |
| JP | 2014095110 | | 5/2014 |
| JP | 2017128806 | | 7/2017 |
| JP | 2020180315 | A | 11/2020 |
| WO | 2014002904 | A1 | 1/2014 |

OTHER PUBLICATIONS

First Office Action issued on Dec. 6, 2022 regarding the JP Patent Application No. 2021-563324.
First OA of CN Application No. 201910415321.0.
Second OA of CN Application No. 201910415321.0.
Written Opinion of ISA for PCT/CN2019/127645.
Notice of Rejection of CN Application No. 201910415321.0.
Professional Practice of Energy Chemical Engineering. Oct. 31, 2016, Li Yanhong.
The Development Strategy of Key Projects to Build Chi. Nov. 30, 2017, Tang Qisheng.
International Search Report of PCT No. PCT/CN2019/127645.

ELECTROLYSIS ELECTRODE AND PREPARATION METHOD THEREFOR, ELECTROLYSIS APPARATUS, AND CLOTHING TREATMENT DEVICE

CROSS-REFERENCES TO RELATED APPLICATIONS

The present disclosure is a national phase application of International Application No. PCT/CN2019/127645, filed on Dec. 23, 2019, which claims priority to Chinese patent application No. 201910346470.6 filed on Apr. 26, 2019 and Chinese patent application No. 201910415321.0 filed on May 17, 2019, the entire contents of which are hereby incorporated by reference in their entirety.

FIELD

The disclosure relates to the field of electrochemical sterilization, and in particular to an electrolysis electrode, a method for preparing the electrolysis electrode, an electrolysis apparatus and a clothing treatment device.

BACKGROUND

In the aspect of water environment treatment, an electrochemical treatment technology is widely concerned by people due to its prominent position in environmental pollution treatment such as industrial wastewater degradation and regeneration, soil remediation, etc. Among electrode catalytic materials involved in an electrochemical process, iridium-based oxides appear relatively active in the field of electrochemistry. Although the iridium-based oxide electrode material has many advantages, such as high electrocatalytic activity, strong corrosion resistance, good durability and the like, it still has some unstable and abnormal failure factors in industrial applications, for example, due to difference between thermal expansion coefficients of an iridium-based oxide coating and a base body, and the iridium-based oxide coating generally exhibits a crisscrossing crack structure. Due to a surface morphology with cracks, high-temperature oxidation of a substrate of the base body is easily caused by invasion of oxygen in a subsequent heat treatment process of the electrode, and in the electrocatalytic process, electrochemical oxidation of the surface of the base body is also easily accelerated due to the fact that electrolyte permeates into an interface between the base body and the coating through the cracks. The oxidation of the surface of the base body may shorten the service life of the electrode, so that the electrode catalytic material falls off and is even inactivated.

In the aspect of washing clothes by a clothing treatment device, in the process of using the clothing treatment device, pollutants such as clothes fibers and impurities are accumulated more and more along with time, and in addition, due to the fact that the interior of the clothing treatment device is wet, a hotbed is provided for growth of bacteria and fungi; and moreover, a case where colored fabrics release dyes into aqueous solution is often encountered, such dyes are then transferred to fabrics of different colors than the dyes, resulting in mutual staining of the colors of clothes.

SUMMARY

In view of the above, embodiments of the disclosure are intended to provide an electrolysis electrode with long service life and good sterilization effect, a method for preparing the electrolysis electrode, an electrolysis apparatus, and a clothing treatment device with long service life, good sterilization effect and capable of effectively degrading and decolorizing free dye molecules in water to achieve a purpose of preventing color-cross.

One embodiments of the disclosure provides an electrolysis electrode, including: a base body, a transition layer attaching to a surface of the base body, and an electrode catalytic material layer attaching to a surface of the transition layer, here the transition layer has a thickness allowing electrons to penetrate through the transition layer.

In some implementations, the thickness of the transition layer is 1-10 nm.

In some implementations, the base body is a titanium base body; and/or, the transition layer is an aluminum oxide transition layer.

In some implementations, the electrode catalytic material layer is a platinum layer plated on the surface of the transition layer, or a boron-doped diamond film material deposited on the surface of the transition layer.

In some implementations, the electrode catalytic material layer is a nano hybrid coating formed by a stable oxide material and an active oxide material together; the stable oxide material includes one or more of: silicon dioxide, tantalum pentoxide, cobalt dioxide, tungsten trioxide, or ruthenium dioxide; and the active oxide material includes one or more of: an iridium-based oxide, a tin-based oxide, or a lead-based oxide.

In some implementations, the weight ratio of the active oxide material to the stable oxide material is (0.2-0.9):(0.1-0.8).

Some embodiments of the disclosure provides an electrolysis apparatus, including a cathode which is made of a metal material or is any of the above electrodes, and an anode which is any of the above electrodes.

Other embodiments of the disclosure provides a clothing treatment device, including an outer cylinder, an inner cylinder rotatably arranged in the outer cylinder, and any of the above electrolysis apparatuses, the electrolysis apparatus is arranged between the inner cylinder and the outer cylinder.

Yet other embodiments of the disclosure provides a method for preparing the electrolysis electrode of in part of the above embodiments, including the following operations.

The transition layer is formed on the surface of the base body, the transition layer has a thickness allowing electrons to penetrate through the transition layer.

The electrode catalytic material layer is formed on the surface of the transition layer.

In some implementations, the transition layer is an aluminum oxide transition layer; the forming the transition layer on the surface of the base body includes the following operations. By taking pure aluminum as a target material, argon as a sputtering gas, oxygen as a reaction gas and the base body as a substrate, the transition layer is formed on the surface of the base body by adopting a radio frequency magnetron sputtering method; or, by taking trimethylaluminum vapor as a precursor and water vapor as an oxidizing agent, the transition layer is formed on the surface of the base body under a temperature of 80-300 DEG C by adopting an atom layer deposition method.

In some implementations, the forming the electrode catalytic material layer on the surface of the transition layer includes the following operations.

Chloroiridic acid and cobalt chloride are dispersed in a solvent to form a mixed solution.

The surface of the transition layer is coated with the mixed solution.

Heat treatment is performed to form, on the surface of the transition layer, a nano hybrid coating of iridium oxide and cobalt oxide which is the electrode catalytic material layer.

In some implementations, the molar ratio of the chloroiridic acid to the cobalt chloride is 1:0.02 to 1:4.

In some implementations, the mixed solution includes a chelating agent in a type of hydroxycarboxylic acid.

In some implementations, the heat treatment includes the following operations.

The mixed solution is coated for many times, and the electrolysis electrode is baked for 2-20 minutes under a temperature of 100-400 DEG C after each coating.

The electrolysis electrode is baked for 60-120 minutes under a temperature of 400-650 DEG C, after coating the mixed solution for the last time.

According to the electrolysis electrode disclosed by the embodiments of the disclosure, the transition layer is relatively thin, so that electrons may pass through the transition layer due to a quantum tunneling effect, therefore the electrocatalytic performance of the electrolysis electrode is not affected substantially; moreover, the transition layer plays a role of transition connection, so that the phenomenon that the electrode catalytic material layer cracks due to the difference of expansion coefficients between the base body and the electrode catalytic material layer in the related art may be greatly improved, and then the service life of the electrolysis electrode is prolonged.

According to the clothing treatment device disclosed by the embodiments of the disclosure, during its working process, when the outer cylinder is filled with water, the electrolysis apparatus is activated and may generate hydroxyl free radicals (•OH) with strong oxidation activity. The •OH has extremely high oxidation potential and extremely strong oxidation capacity, may form a rapid chain reaction with most organic pollutants, may realize sterilization and disinfection at a low temperature and does not damage clothes. A part of the •OH reacts with chlorine water in tap-water to generate active chlorine, and the active chlorine may exist for a long time and has a long-term bacteriostatic effect. The electrolysis apparatus generates a large number of hydroxyl free radicals to oxidize and destroy chromophoric groups of dye molecules dissociated from colored clothes into water in the washing process to decolorize dyes, so that the free dyes are prevented from staining light-color clothes to cause color-cross, and the dye molecules are decomposed into harmless carbon dioxide, water, inorganic salt and the like through continuous reaction. Moreover, a large number of microbubbles may be generated by the electrolysis electrode, due to the fact that the diameters of the microbubbles are small, the microbubbles may well enter the interior of cloth fibers in the washing process, the microbubbles are continuously generated for circulation flushing through blasting, adsorption and floating effects of the microbubbles, to assist a detergent to thoroughly remove sebum, grease, tiny dust and other dirt accumulated in the cloth fibers, and thus the cleaning effect may be improved.

DETAILED DESCRIPTION OF THE DISCLOSURE

It should be noted that the embodiments of the disclosure may be combined with each other without conflict, and the detailed description in the specific implementations should be understood as an explanation of the spirit of the disclosure and should not be taken as unduly limiting the disclosure.

The embodiments of the disclosure provides an electrolysis electrode, which may be a cathode or an anode.

Figure 1:
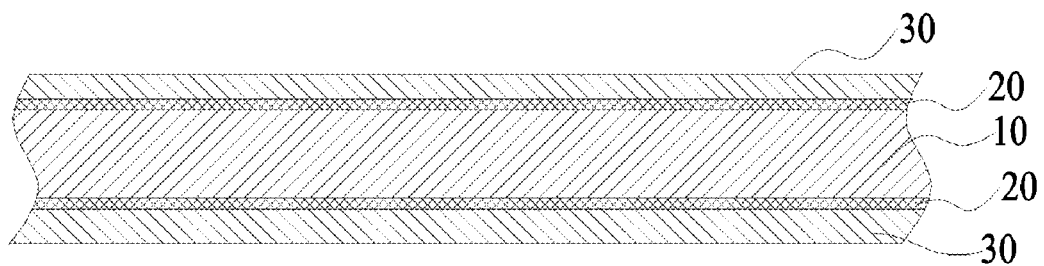
FIG. 1 is a schematic diagram of an electrolysis electrode according to an embodiment of the disclosure.

Referring to FIG. 1, the electrolysis electrode includes a base body 10, a transition layer 20 attaching to a surface of the base body 10, and an electrode catalytic material layer 30 attaching to a surface of the transition layer 20, that is, the transition layer 20 is sandwiched between the surface of the base body 10 and the electrode catalytic material layer 30, and the transition layer 20 has a thickness allowing electrons to penetrate through the transition layer 20.

According to the electrolysis electrode disclosed by the embodiment of the disclosure, the transition layer 20 is relatively thin, so that electrons may pass through the transition layer 20 due to a quantum tunneling effect, therefore the electrocatalytic performance of the electrolysis electrode is not affected substantially; moreover, the transition layer 20 plays a role of transition connection, so that the phenomenon that the electrode catalytic material layer cracks due to the difference of expansion coefficients between the base body and the electrode catalytic material layer in the related art may be greatly improved, and then the service life of the electrolysis electrode is prolonged.

In an embodiment, the thickness of the transition layer 20 is 1-10 nm (nanometer), for example, 1 nm, 2 nm, 4 nm, 6 nm, 8 nm, and 10 nm. Therefore the transition layer 20 may play a relatively reliable protection role on the surface of the base body 10, and the electrocatalytic performance of the electrolysis electrode is not affected substantially by the transition layer 20.

In an embodiment, the base body 10 is a titanium base body, and the titanium base body may be made of pure titanium or may be formed by plating a layer of titanium film on a surface of another material.

The material of the transition layer 20 may be of various types, such as silicon nitride (SiN), titanium nitride (TiN), $TiO_2$ nanotubes, etc.

In an embodiment, the transition layer 20 is an aluminum oxide transition layer, and aluminum oxide (with the chemical formula of $Al_2O_3$) itself is very dense, so that relatively closed protection may be formed on the base body 10; the aluminum oxide has good high-temperature resistance, corrosion resistance and good mechanical strength, and has small possibility of breaking, so that the surface of the base body 10 is difficult to be further oxidized under the protection of the transition layer 20 even if the electrolysis electrode is subject to high-temperature or electrochemical conditions, and thus the service life of the electrolysis electrode is greatly prolonged; moreover, the difference of expansion coefficients between the transition layer 20 and the titanium base body is small, the difference of expansion coefficients between the electrode catalytic material layer 30 and the transition layer 20 may also be small, so that the phenomenon that the electrode catalytic material layer cracks due to the difference of expansion coefficients between the base body and the electrode catalytic material layer in the related art may be greatly improved, and then the service life of the electrolysis electrode is prolonged.

The electrode catalytic material layer 30 may have many options, for example, in an embodiment, the electrode catalytic material layer 30 is formed as a platinum layer plated on the surface of the transition layer 20, or a boron-doped diamond film material deposited on the surface of the transition layer 20.

In another embodiment, the electrode catalytic material layer 30 is a nano hybrid coating formed by a stable oxide material and an active oxide material together; the stable oxide material includes one or more of: silicon dioxide, tantalum pentoxide, cobalt dioxide, tungsten trioxide, or ruthenium dioxide; and the active oxide material includes one or more of: an iridium-based oxide, a tin-based oxide, or a lead-based oxide. The electrode catalytic material layer 30 in the embodiment is low in cost and good in economic efficiency, and thus is beneficial to popularization and usage.

It should be noted that in the embodiments of the disclosure, the iridium-based oxide includes $IrO_2$; the tin-based oxide includes $SnO_2$; and the lead-based oxide may be one or more of $PbO$, $Pb_3O_4$, $PbO_2$, or the like.

The surface of the nano hybrid coating is a microcosmic rough surface, so that the effective electrochemical active surface area of the electrolysis electrode is increased, proper reaction sites are provided for oxygen evolution reaction, and the electrolysis efficiency of the electrolysis apparatus may be improved.

In some embodiments, the weight ratio of the active oxide material to the stable oxide material is (0.2-0.9):(0.1-0.8). It should be noted that the sum of the weight ratios of the active oxide material to the stable oxide material is 1. This ratio enables a suitable ratio of the active oxide material in the electrode catalytic material layer 30, so that the activity of the electrode catalytic material is improved.

Embodiments of the disclosure provides an electrolysis apparatus, including a cathode which is made of a metal material or is any of the above electrolysis electrodes, and an anode which is any of the above electrolysis electrodes; and the cathode. It should be noted that the metal material may be stainless steel or other metal materials which are not easy to rust, so that the service life of the cathode is prolonged.

In an embodiment, when each of the cathode and the anode is the electrolysis electrode as described above, that is, two electrolysis electrodes are present, one serves as the anode and the other serves as the cathode. On one hand, in the electrolysis process, the corrosion speed of one electrolysis electrode may exceed the corrosion speed of the other electrolysis electrode, when the corrosion degree of one electrolysis electrode reaches an amount, the positive electrode and the negative electrode of a power supply may be switched, so that the polarities of the two electrolysis electrodes are exchanged, therefore the two electrolysis electrodes have approximately the same service life, and then the service life of the electrolysis apparatus may be prolonged. On the other hand, scale is gradually generated on the surface of the cathode in the water electrolysis process, the scale is difficult to be removed, and the electrolysis efficiency of the water electrolysis apparatus is seriously affected under the condition where the water quality is poor and too much scale is accumulated. In the embodiment of the disclosure, when the scale on the cathode reaches an amount, the positive electrode and the negative electrode of the power supply are switched, then the polarities of two electrolysis electrodes are exchanged, the electrode on which some scale is deposited previously serves as the anode, the scale is gradually stripped from the anode, and thus the effect of removing the scale is achieved.

Embodiments of the disclosure provide a clothing treatment device (not shown in the figure), including an outer cylinder (not shown in the figure), an inner cylinder (not shown in the figure) rotatably arranged in the outer cylinder, and the above electrolysis apparatus, here the electrolysis apparatus is arranged between the inner cylinder and the outer cylinder.

According to the clothing treatment device disclosed by the embodiment of the disclosure, during its working process, when the outer cylinder is filled with water, the electrolysis apparatus is activated and may generate hydroxyl free radicals (•OH) with strong oxidation activity. The •OH has extremely high oxidation potential and extremely strong oxidation capacity, may form a rapid chain reaction with most organic pollutants, may realize sterilization and disinfection at a low temperature and does not damage clothes. A part of the •OH reacts with chlorine water in tap-water to generate active chlorine, and the active chlorine may exist for a long time and has a long-term bacteriostatic effect. The electrolysis apparatus generates a large number of hydroxyl free radicals to oxidize and destroy chromophoric groups of dye molecules dissociated from colored clothes into water in the washing process to decolorize dyes, so that the free dyes are prevented from staining light-color clothes to cause color-cross, and the dye molecules are decomposed into harmless carbon dioxide, water, inorganic salt and the like through continuous reaction. Moreover, a large number of microbubbles may be generated by the electrolysis electrode, due to the fact that the diameters of the microbubbles are small, the microbubbles may well enter the interior of cloth fibers in the washing process, the microbubbles are continuously generated for circulation flushing through blasting, adsorption and floating effects of the microbubbles, to assist a detergent to thoroughly remove sebum, grease, tiny dust and other dirt accumulated in the cloth fibers, and thus the cleaning effect may be improved.

Figure 2:
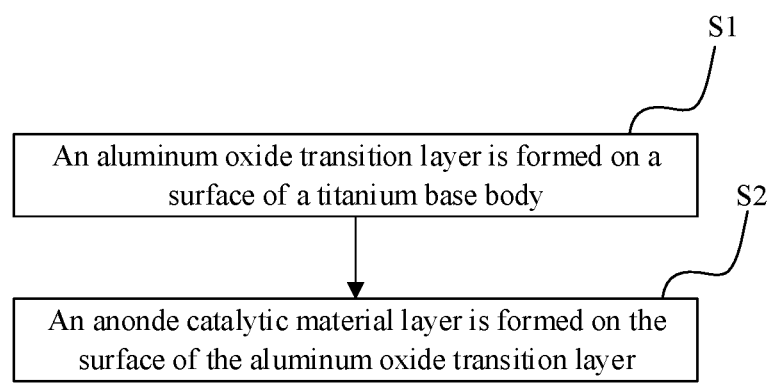
FIG. 2 is a schematic flowchart of a method for preparing an electrolysis electrode according to an embodiment of the disclosure.

One embodiments of the disclosure provides a method for preparing an electrolysis electrode. Referring to FIG. 2, the method includes the following operations.

In operation S1, The transition layer 20 is formed on the surface of the base body 10, here the transition layer 20 has a thickness allowing electrons to penetrate through the transition layer 20.

In operation S2, the electrode catalytic material layer 30 is formed on the surface of the transition layer 20.

There may be multiple methods by which the transition layer 20 is formed on the surface of the base body 10, such as a radio frequency magnetron sputtering method or an atomic layer deposition method.

In an embodiment, the transition layer 20 is an aluminum oxide transition layer. The method by which the transition layer 20 is formed through the radio frequency magnetron sputtering method includes the following operations. By taking pure aluminum as a target material, argon as a sputtering gas, oxygen as a reaction gas and the base body 10 as a substrate, the transition layer 20 is formed on the surface of the base body 10 by adopting a radio frequency magnetron sputtering method. It may be appreciated that other operations of the radio frequency magnetron sputtering method may be implemented by using the related art and will not be elaborated herein. In the radio frequency magnetron sputtering process, aluminum atoms are oxidized and carry high energy to be shot to the base body 10, the transition layer 20 is formed on the surface of the base body 10, and the binding force between the transition layer 20 and the surface of the base body 10 is large.

In another embodiment, the transition layer 20 is an aluminum oxide transition layer. The method by which the transition layer 20 is formed through the atom layer deposition method includes the following operations. By taking trimethylaluminum vapor as a precursor and water vapor as an oxidizing agent, the transition layer 20 is formed on the surface of the base body 10 under a growth temperature of 80-300 DEG C by adopting an atom layer deposition method, so that the transition layer 20 may grow on the surface of the base body 10 in situ, and in the process that the transition layer 20 grows in situ, the newly generated transition layer 20 has high chemical activity, so that the binding force between the transition layer 20 and the surface of the base body 10 is large. In one embodiment, the growth temperature is 100 DEG C to 200 DEG C, which is more suitable for the formation of the transition layer 20.

The electrode catalytic material layer 30 may have many options, for example, in an embodiment, the electrode catalytic material layer 30 is formed as a platinum layer plated on the surface of the transition layer 20, or a boron-doped diamond film material deposited on the surface of the transition layer 20.

In another embodiment, the electrode catalytic material layer 30 is a nano hybrid coating formed by a stable oxide material and an active oxide material together; the stable oxide material includes one or more of: silicon dioxide, tantalum pentoxide, cobalt dioxide, tungsten trioxide, or ruthenium dioxide; and the active oxide material includes one or more of: an iridium-based oxide, a tin-based oxide, or a lead-based oxide. The electrode catalytic material layer 30 in the embodiment is low in cost and good in economic efficiency, and thus is beneficial to popularization and usage.

The surface of the nano hybrid coating is a microcosmic rough surface, so that the effective electrochemical active surface area of the electrolysis electrode is increased, proper reaction sites are provided for oxygen evolution reaction, and the electrolysis efficiency of the electrolysis apparatus may be improved.

In the embodiment of the disclosure, the process of preparing the nano hybrid coating is described by an example of taking cobalt dioxide as the stable oxide material and the iridium-based oxide as the active oxide material.

In particular, the operation S2 includes the following operations.

In operation S21, chloroiridic acid (dihydrohexachloroiridic acid, the chemical formula of which is $H_2IrC_{16} \cdot 6H_2O$) and cobalt chloride (the chemical formula of which is $CoCl_2$) are dispersed in a solvent to form a mixed solution.

In operation S22, the surface of the transition layer 20 is coated with the mixed solution.

In operation S23, heat treatment is performed to form, on the surface of the transition layer 20, a nano hybrid coating of iridium oxide and cobalt oxide, in which the nano hybrid coating is the electrode catalytic material layer 30.

In particular, the solvent is one or more of: water, benzene, toluene, xylene, pentane, hexane, octane, cyclohexane, cyclohexanone, toluene cyclohexanone, chlorobenzene, dichlorobenzene, dichloromethane, methanol, ethanol, isopropanol, ethylene glycol, diethyl ether, methyl acetate, ethyl acetate, propyl acetate acetone, methyl butanone, methyl isobutyl ketone, ethylene glycol monomethyl ether, ethylene glycol monoethyl ether, ethylene glycol monobutyl ether, or acetonitrile.

The coating may be performed by manual coating or by other methods such as electrophoresis, spray coating, etc.

The molar ratio of the chloroiridic acid to the cobalt chloride is 1:0.02 to 1:4, and the ratio allows the weight ratio of the stable oxide material to the active oxide material in the electrode catalytic material layer 30 after heat treatment to be maintained in a range of (0.2-0.9):(0.1-0.8), so that the activity of the electrode catalytic material is improved. In the embodiment of the disclosure, the molar ratio of chloroiridic acid to cobalt chloride is 1:0.2 to 1:3, so that the catalytic material of the electrolysis electrode has better activity.

In order to allow the chloroiridic acid and the cobalt chloride which are used as precursors to have good dispersibility in the solution and allow a good binding force between the electrode catalytic material layer 30 and the transition layer 20, in an embodiment, the mixed solution includes a chelating agent in a type of hydroxycarboxylic acid, the chelating agent in a type of hydroxycarboxylic acid not only has chelating capacity, but also has good dispersion capacity and biodegradability, and thus the environment protection requirement is met. It should be noted that in the related art, there are various types of chelating agents, such as polyphosphates, aminocarboxylicacid, 1,3-diketones, hydroxycarboxylic acid, and polyamines. In the embodiment, the chelating agent is hydroxycarboxylic acid, and there are various chelating agents in a type of hydroxycarboxylic acid are available, including gluconic acid, polyacrylic acid, maleic acid and the like.

The operation S23 includes the following operations.

The mixed solution is coated for many times, and the electrolysis electrode is baked for 2-20 minutes under a temperature of 100-400 DEG C after each coating; coating and baking are performed many times until the thickness of the electrode catalytic material layer 30 reaches the desired thickness.

The electrolysis electrode is baked for 60-120 minutes under a temperature of 400-650 DEG C, after coating the mixed solution for the last time.

Through heat treatment, the solvent may be volatilized or degraded, and finally, the nano hybrid coating of iridium oxide and cobalt oxide is generated on the surface of the transition layer 20 in situ.

The embodiments/implementations provided in the disclosure may be combined with each other without conflict.

The foregoing embodiments of the disclosure and is not intended to limit the disclosure, and various modifications and variations of the disclosure may be available.

What is claimed is:

1. A clothing treatment device, comprising an outer cylinder, an inner cylinder rotatably arranged in the outer cylinder, and an electrolysis apparatus; wherein
    the electrolysis apparatus is arranged between the inner cylinder and the outer cylinder;
    the electrolysis apparatus comprises an anode made of an electrolysis electrode;
    the electrolysis electrode comprises a base body, a transition layer attaching to a surface of the base body, and an electrode catalytic material layer attaching to a surface of the transition layer; and
    the transition layer has a thickness allowing electrons to penetrate through the transition layer.

2. The clothing treatment device of claim 1, wherein the thickness of the transition layer is 1-10 nm.

3. The clothing treatment device of claim 1, wherein the base body is a titanium base body; and/or, the transition layer is an aluminum oxide transition layer.

4. The clothing treatment device of claim 1, wherein the electrode catalytic material layer is a platinum layer plated on the surface of the transition layer, or a boron-doped diamond film material deposited on the surface of the transition layer.

5. The clothing treatment device of claim 1, wherein the electrode catalytic material layer is a nano hybrid coating formed by a stable oxide material and an active oxide material together; the stable oxide material comprises one or more of: silicon dioxide, tantalum pentoxide, cobalt dioxide, tungsten trioxide, or ruthenium dioxide; and the active oxide material comprises one or more of: an iridium-based oxide, a tin-based oxide, or a lead-based oxide.

6. The clothing treatment device of claim 5, wherein a weight ratio of the active oxide material to the stable oxide material is (0.2-0.9):(0.1-0.8).

7. The clothing treatment device of claim 1, wherein the electrolysis apparatus further comprises a cathode made of a metal material or is an electrolysis electrode, the electrolysis electrode comprising:
    a base body, a transition layer attaching to a surface of the base body, and an electrode catalytic material layer attaching to a surface of the transition layer, wherein the transition layer has a thickness allowing electrons to penetrate through the transition layer.

\* \* \* \* \*